United States Patent [19]

Seki et al.

[11] 3,867,709

[45] Feb. 18, 1975

[54] MUTING SYSTEM FOR POWER AMPLIFIER

[75] Inventors: Kunio Seki; Ryozo Kontani, both of Tokyo, Japan

[73] Assignee: Hitachi Ltd., Tokyo, Japan

[22] Filed: Oct. 4, 1973

[21] Appl. No.: 403,407

[30] Foreign Application Priority Data

Oct. 4, 1972 Japan .............................. 47-99006

[52] U.S. Cl. ........................ 330/15, 330/25, 330/28, 330/29

[51] Int. Cl. ............................................ H03f 3/26

[58] Field of Search ............ 330/15, 22, 25, 28, 29, 330/51, 207 P; 325/319, 402, 403; 179/1 P, 100.2 K

[56] References Cited

UNITED STATES PATENTS 3,673,345 6/1972 Ban ......................... 179/100.2 K X 3,691,427 9/1972 Honda et al. ............... 330/207 P X

OTHER PUBLICATIONS

Jones, "Constructing a 10-Watt Stereo Amplifier," Audio, May, 1971, pp. 30, 32–35.

*Primary Examiner*—James B. Mullins
*Attorney, Agent, or Firm*—Craig & Antonelli

[57] ABSTRACT

An electronic muting system for a power amplifier, wherein a muting portion for controlling the mid-point output of a push-pull amplifier portion of the power amplifier is connected between a signal path of the push-pull amplifier portion and a reference potential portion, and wherein, when the muting portion is manipulated, a preamplifier portion of the power amplifier blocks input signals.

8 Claims, 6 Drawing Figures

MUTING SYSTEM FOR POWER AMPLIFIER

BACKGROUND OF THE INVENTION

1. Field of the Invention

The present invention relates to a power amplifier, and more particularly to a muting system for sound equipment and appliances.

2. Description of the Prior Art

In, for example, car stereos and general tape recorders, in order to prevent the tape from contacting the magnetic head and generating unpleasant noises during the quick feed and rewinding operations for the tape, a mechanism is employed which mechanically separates the tape from the magnetic head which mechanism operates in interlocking relationship with the switches for performing these operations. However, since such a mechanism is structurally complicated, the frequency of troubles is high and the reliability is poor.

In order to solve the above-mentioned problem, there has been proposed a method in which, in the case of the foregoing operations, an attenuator is interposed between the power amplifier and a preamplifier to thus attenuate input signals to the power amplifier. This method, however, has had the disadvantage that noises ascribable to the switch manipulation for initiating the muting operation and other induced noises are generated with this arrangement, and that unpleasant noises are generated by bias fluctuations within the power amplifier.

SUMMARY OF THE INVENTION

It is therefore the principal object of the present invention to provide an improved muting system for a power amplifier to carry out muting electronically.

Another object of the present invention is to provide a muting system for a power amplifier which can carry out muting by mere addition of a simple circuit to a prior art power amplifier.

Still another object of the present invention is to provide a muting system for a power amplifier which provides trouble-free operation and has a high reliability.

Yet another object of the present invention is to provide a muting system for a power amplifier which prevents unpleasant noises from being generated even during muting manipulation Yet another object of the present invention is to provide a muting system for a power amplifier which prevents the muting portion from ecoming an AC load of any other circuit.

In order to accomplish such objects, the present invention consists in that a muting portion for controlling a mid-point output potential is connected halfway in the signal path of a push-pull power amplifier portion and that a preamplifier portion blocks the input signal by manipulating the muting portion.

PREFERRED EMBODIMENTS OF THE INVENTION

Figure 1:
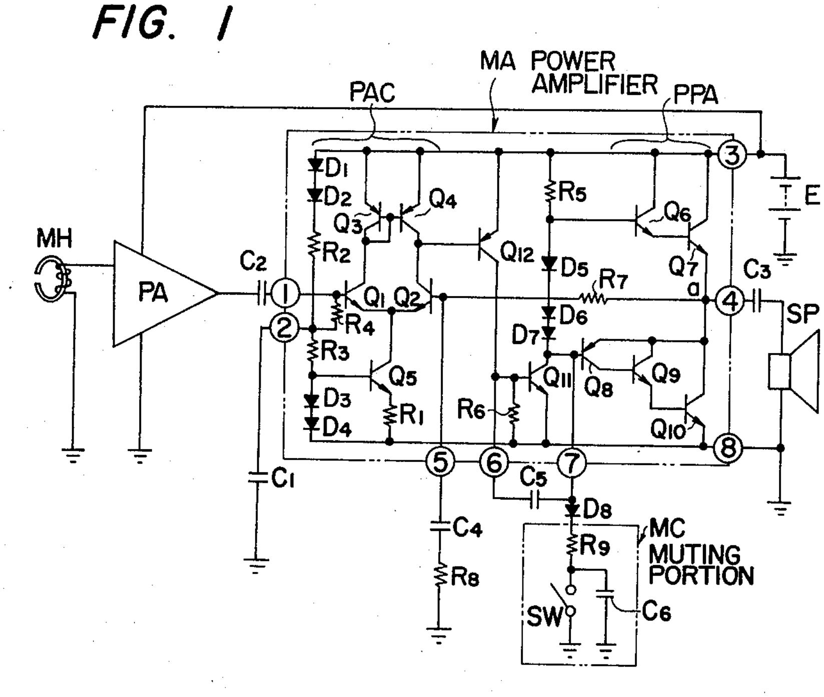
FIGS. 1 to 6 are schematic circuit diagrams each showing a respective embodiment of the muting system for a power amplifier according to the present invention.

FIG. 1 illustrates one embodiment of the muting system for a power amplifier according to the present invention. Referring to the figure, MH designates a magnetic head, PA a preamplifier, MA a power amplifier, MC a muting portion, SP a speaker, and E a DC power source.

A signal derived from a tape by the magnetic head MH is subjected to voltage amplification and power amplification by the premaplifier PA and the power amplifier MA, and the signal is then supplied to the speaker SP. In this case, with notice taken of the fact that the push-pull power amplifier portion PPA of the power amplifier MA effects no voltage amplification, the muting portion MC is so constructed as to impart a slight potential change to the mid-point output of the push-pull power amplifier portion PPA. Accordingly, when the muting portion MC is actuated, the potential change of the mid-point output is transmitted through a DC feedback path to the preamplifier portion PAC, to bring the preamplifier portion PAC into the saturation state. The input signal is thus blocked, so that muting is effected.

The construction and operation of the power amplifier MA as well as the muting portion MC will be described in detail hereunder.

In the embodiment, the principal parts of the power amplifier MA are constructed as an integrated circuit. The parts are enclosed with broken lines. The preamplifier portion PAC of the power amplifier MA is constituted of a differential amplifier. It comprises transistors for differential amplification $Q_1$ and $Q_2$ whicl are emitter-coupled, transistors $Q_3$ and $Q_4$ which are arranged between the collectors of the transistors $Q_1$, $Q_2$ and the DC power source E and which constitute a constant-current load circuit, a transistor $Q_5$ which is connected between the emitters of the transistors $Q_1$, $Q_2$ and ground and which constitutes a constant-current absorption circuit along with a resistance $R_1$, and diodes $D_1$ – $D_4$, resistances $R_2$ – $R_4$ and a capacitor $C_1$, which constitute bias circuits for the transistors $Q_1$ and $Q_5$. Accordingly, when the input signal is supplied from the preamplifier PA through a capacitor $C_2$ to the transistor $Q_1$, it is subjected to voltage amplification by the differential amplifier in its relation to the base voltage of the transistor $Q_2$, and is derived as an output from the collector of the transistor $Q_2$.

The push-pull amplifier portion PPA of the power amplifier MA has transistors $Q_6$ and $Q_7$ and transistors $Q_8$ – $Q_{10}$ each associated in the Darlington connection. This circuit constitutes a so-called complementary push-pull circuit. The base of the transistor $Q_8$ is connected to the base of the transistor $Q_6$ through diodes $D_5$, $D_6$ and $D_7$ which constitute an idling circuit. The base of the transistor $Q_6$ is further connected through a resistance $R_5$ to the DC power source E.

The base of the transistor $Q_8$ is also connected to the collector of a driver transistor $Q_{11}$. The emitter of the transistor $Q_{11}$ is ground, while the base is connected to the collector of the transistor $Q_{12}$ for effecting a level shift of the output of the preamplifier portion PAC. The emitter of the transistor $Q_{12}$ is connected to the power source E.

The juncture (mid-point) *a* between the emitter of the transistor $Q_7$ and the collector of the transistor $Q_{10}$ is connected through a capacitor $C_3$ to the speaker SP. The juncture *a* is further connected to the base of the transistor $Q_2$ of the preamplifier portion PAC through a resistance $R_7$ constituting a DC negative feedback circuit. Between the base of the transistor $Q_2$ and ground, there are connected a capacitor $C_4$ and a resistance $R_8$ which constitute an AC negative feedback circuit. Between the collector to the transistor $Q_{12}$ and the base of the transistor $Q_8$, there is connected a capacitor $C_5$ for phase compensation and oscillation prevention.

In FIG. 1, ①-⑧ indicate various connection terminals of the integrated circuit.

On the other hand, the muting portion MC is composed of a resistance $R_9$ and a switch SW which are connected in series with each other, and a capacitor $C_6$ which is connected in parallel with the switch SW. One end of the resistance $R_9$ is connected through a diode $D_8$ to the base of the transistor $Q_8$ constituting the push-pull power amplifier portion PPA, while one end of the switch SW is grounded. The resistance value of the resistance $R_9$ is so set that when the switch SW is closed, the base potential of the transistor $Q_8$ may be lowered from a predetermined value by, for example, approximately 100 mV.

With such a construction, the switch SW of the muting portion MC is closed in interlocking relationship with, for example, the quick feed or rewinding mechanism of a tape recorder (not shown). Upon closure of the switch SW, the base potential of the transistor $Q_8$ is lowered by approximately 100 mV. Since, in this case, the push-pull power amplifier portion PPA does not perform voltage amplification, the above-mentioned voltage change appears on the output side as it is. Thus, it lowers the potential of the point *a* by about 100 mV from ½ $V_{CC}$ ($V_{cc}$: the voltage of the DC power source E).

The change of the potential of the point *a* is transmitted through the resistance $R_7$ to the base of the transistor $Q_2$ of the preamplifier portion PAC, and lowers the base potential of the transistor $Q_2$ by about 100 mV. Accordingly, the transistor $Q_2$ changes to the "off" state. In consequence, the input signal supplied to the base of the transistor $Q_1$ is blocked by the preamplifier portion PAC without being fed to the push-pull power amplifier portion PPA.

The operation of the preamplifier portion PAC will now be described more specifically. The differential amplifier circuit constituting the preamplifier portion PAC has a limiter function, and exhibits a transfer characteristic such that even when the input signal exceeds ± 100 mV, the output does not change. Accordingly, if the voltage applied to the base of the transistor $Q_2$ is lowered by 100 mV, the transistor $Q_2$ is changed to the perfectly cut-off state. Even if the input signal is supplied to the base of the transistor $Q_1$, no amplification operation is carried out. For this reason, the input signal is not supplied to the push-pull power amplifier portion PPA, and no sound emanates from the speaker SP.

At this time, the voltage change at the mid-point *a* is approximately 100 mV, and it does not cause any unpleasant noise. Consequently, the unpleasant noises otherwise issuing forth during the rewinding or quick feed operation of the tape are not generated at all.

Next, upon completion of the quick feed or rewinding operation for the tape, the mechanism is reset, and therewith, the switch SW is opened. A sudden potential change on the side of the base of the transistor $Q_8$ at this time, however, is absorbed by the capacitor $C_6$ connected in parallel with the switch SW. In other words, the base potential of the transistor $Q_8$ is gradually raised in accordance with a time constant determined by the capacitor $C_6$ and the resistance $R_9$. Consequently, the emanation of the unpleasant noises from the speaker SP is also avoided when the switch SW of the muting portion MC is opened.

The muting portion MC is connected through the diode $D_8$ to the signal path of the push-pull power amplifier portion PPA, so that it does not become a load as regards AC signals.

Figure 2:
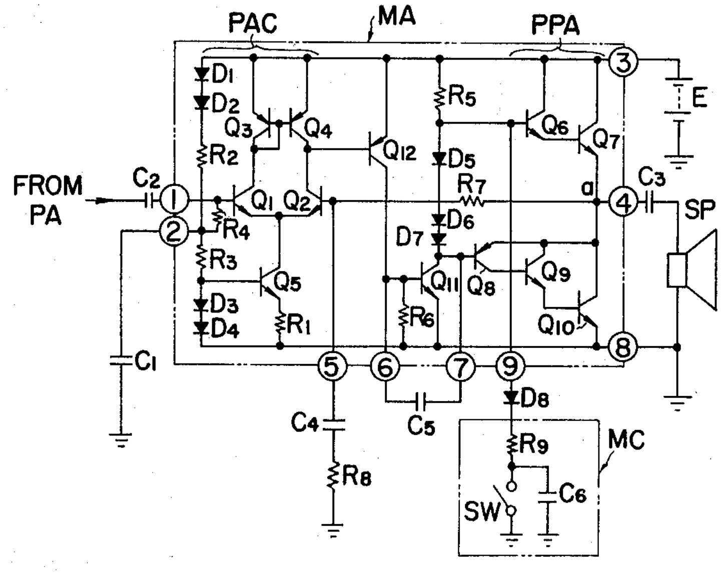

FIG. 2 shows another embodiment of the muting system for a power amplifier according to the present invention. In this embodiment, the muting portion MC is connected to the base of the transistor $Q_6$.

With such a construction, when the switch SW of the muting portion MC is closed, the base potential of the transistor $Q_6$ lowers. Thus, the potential of the point *a* shifts by the base-emitter voltage of the transistors $Q_6$, $Q_7$. Accordingly, the base potential of the transistor $Q_2$ of the preamplifier portion PAC changes through the resistance for the DC feedback $R_7$ and in correspondence with the voltage change to the point *a*, to bring the preamplifier portion PAC into the limiting state. Thus, the transistors $Q_{12}$, $Q_{11}$ of the push-pull power amplifier portion PPA change to the "off" state, the push-pull power amplifier portion PPA is deprived of the amplifying function, and the muting operation is effected. The remaining construction and operation are the same as in FIG. 1.

Figure 3:
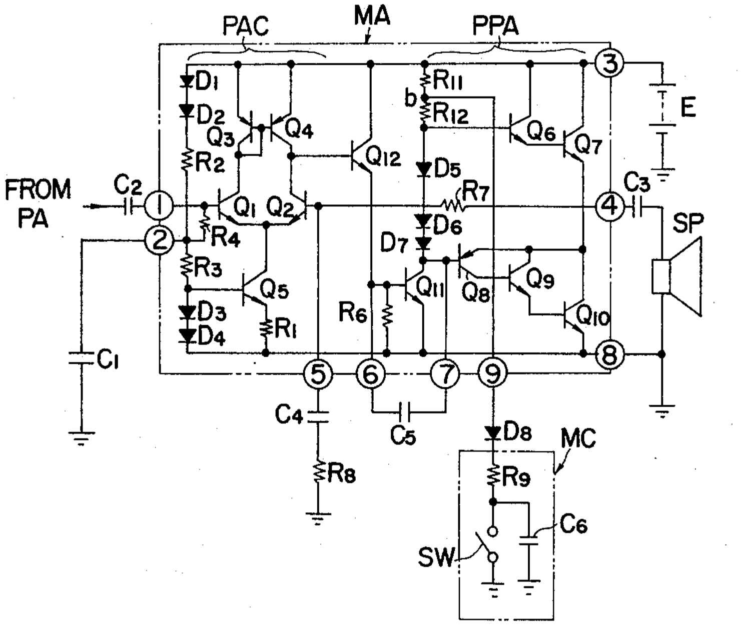

FIG. 3 shows another embodiment of the muting system for a power amplifier according to the present invention. In the embodiment, the resistance $R_6$ in FIG. 1 is divided into resistances $R_{11}$ and $R_{12}$, and the muting portion PMC is connected to the mid-point *b* between the resistances $R_{11}$ and $R_{12}$. Even when the muting portion is connected indirectly with the signal path of the push-pull power amplifier portion PPA in this manner, the muting operation can be effected as in the embodiments in FIGS. 1 and 2.

Figure 4:
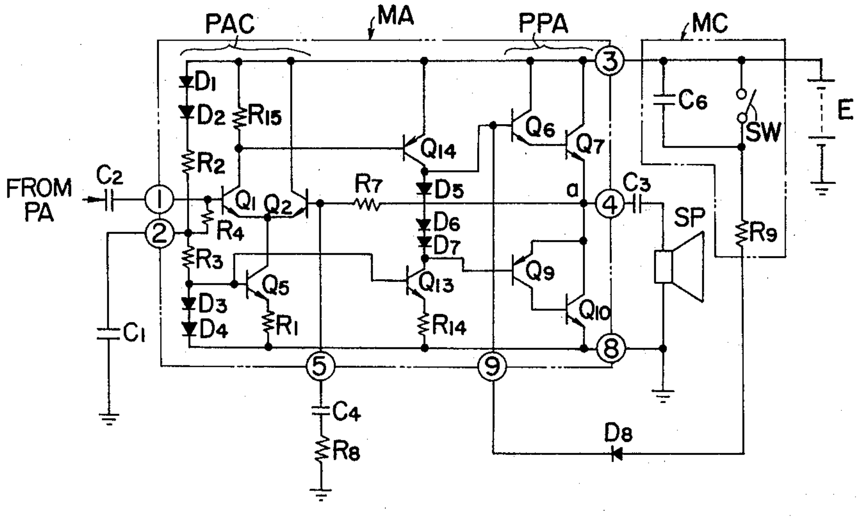

FIG. 4 illustrates another embodiment of the muting system for a power amplifier according to the present invention. In the embodiment, the push-pull power amplifier portion PPA is constructed of transistors $Q_6$, $Q_7$, $Q_9$, $Q_{10}$ and diodes $D_5$, $D_6$, $D_7$. In more detail, the base of the transistor $Q_9$ is connected to the collector of a transistor $Q_{13}$. A resistance $R_{14}$ is connected between the emitter of the transistor $Q_{13}$ and ground, while the base of the transistor $Q_{13}$ is connected to the base of the transistor $Q_5$, so as to constitute a constant-current circuit. The base of the transistor $Q_6$ is connected to the collector of a transistor $Q_{14}$. The emitter of the transistor $Q_{14}$ is connected to the DC power source E, and the base of transistor $Q_{14}$ is connected to the collector of the transistor $Q_1$ of the preamplifier portion PAC. Between the collector of the transistor $Q_{14}$ and the collector of the transistor $Q_{13}$, the diodes $D_5$, $D_6$ and $D_7$ are connected. Between the collector of the transistor for differential amplification $Q_1$ constituting the preamplifier portion PAC and DC power source E, a resistance $R_{15}$ is connected. The collector of the transistor $Q_2$ is directly connected to the DC power source E.

The muting portion MC is arranged between the DC power source E and the base of the transistor $Q_6$. With such construction, when the switch SW of the muting portion MC is closed, the base potential of the transistor $Q_6$ rises, and thereby, the potential of the point *a* also rises. The potential change at the point *a* is transmitted through the DC feedback resistance $R_7$ to the base of the transistor $Q_2$ of the preamplifier portion PAC. In consequence, the transistor $Q_2$ changes to the conductive state, and the transistor $Q_1$ changes to the cut-off state, so that the input signal is prevented from being fed to the push-pull power amplifier portion PPA. The muting operation is thus effected.

Figure 5:
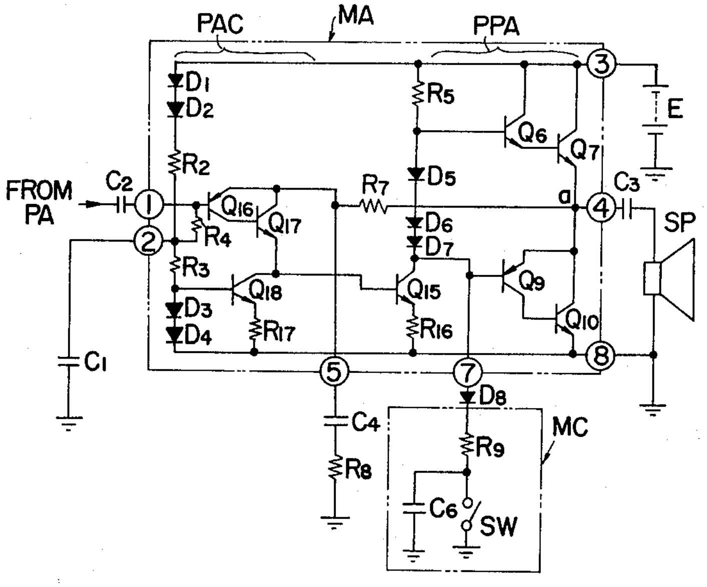

FIG. 5 shows another embodiment of the muting system for a power amplifier according to the present invention. In the embodiment, a class "A" amplifier is employed as the preamplifier portion PAC. With such a construction, when the muting portion MC is manipulated, a transistor $Q_{16}$ changes to the cut-off state due to a potential change at the point *a* Consequently, no input signal is supplied to the push-pull power amplifier portion PPA, and no unpleasant noist emanates from the speaker.

Figure 6:
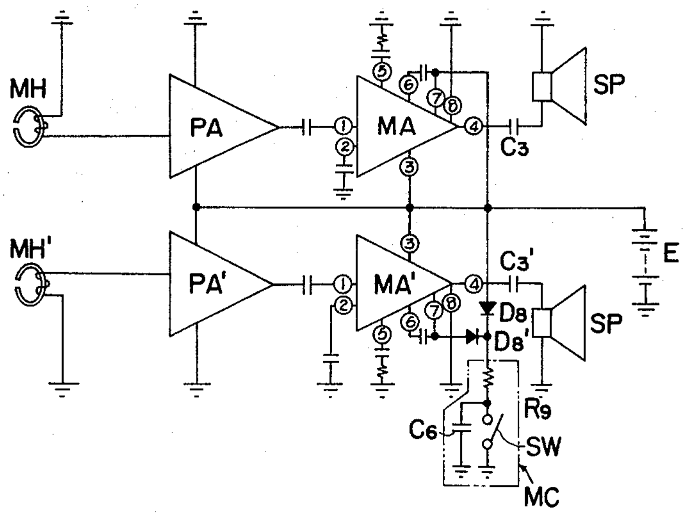

FIG. 6 illustrates still another embodiment of the muting system for a power amplifier according to the present invention. The embodiment is especially applied to a stereo tape recorder. In the figure, elements or components having the same function are distinguished by introducing a mark (').

In this case, diodes $D_8$ and $D_8'$ are interposed between intermediate parts of the signal paths of the power amplifier portions of the respective power amplifiers and the muting portion MC, so as to prevent interference between the respective channels. With such a construction, the provision of only one muting portion MC suffices.

It is a matter of course that the present invention is not rstricted to the foregoing embodiments, but that a variety of applications and modications are encompassed by these basic teachings. For example, in the monaural case, the diode $D_8$ may be omitted. The driver circuit need not be always incorporated between the preamplifier portion PAC and the push-pull power amplifier portion PPA.

The position at which the muting circuit is connected in the present inveniton may be set anywhere, insofar as there is no voltage amplifier portion in the succeeding stage. In order to efficiently apply the muting with low power; however, the position should desirably be a preceding input stage among portions in which the voltage gain is substantially unity (one).

As described above, in conformity with the muting system for a power amplifier according to the present invention the muting is electronically effected, and the mere addition of the simple circuit suffices. Therefore, a power amplifier having trouble-free operation and high reliability can be provided. In addition, in accordance with the present invention, if the capacitor is connected in parallel with the muting switch, no unpleasant noise is generated even during the manipulation of the muting switch (in particular, when stopping the muting). Besides, in accordance with the present invention, the muting portion can be prevented from becoming an AC load of any other circuit in such a way that the diode is interposed between the signal path of the power amplifier portion and the muting portion. Furthermore, if such diodes are used in the multichannel amplifier circuit, a single muting switch suffices. Moreover, the muting switch SW in the present invention can be replaced by an electronic switch, such as a transistor. It is employed in the muting circuit for eliminating inter-channel noises in an FM receiver.

What is claimed is:

1. A power amplifier comprising a pre-amplifier portion connected to an amplifier portion having a push-pull amplifier configuration and a voltage gain of substantially unity, a D.C. feedback path connecting the mid-point output of the push-pull amplifier portion to said pre-amplifier portion, and muting means connected to the push-pull amplifier portion for controlling the mid-point output potential of said push-pull amplifier portion to block input signals in said pre-amplifier portion via said D.C. feedback path.

2. A power amplifier as defined in claim 1, wherein said muting means comprises a resistance element and a switch connected in series between a signal path of said push-pull amplifier portion and one side of a potential source, and a capacitor connected in parallel with said switch.

3. A power amplifier as defined in claim 2, wherein said amplifier portion includes first and second transistors connected in a Darlington configuration to form a first stage, third and fourth transistors connected in a Darlington configuration to form a second stage which is connected in a push-pull amplifier configuration to said first stage to form a mid-point output.

4. A power amplifier as defined in claim 3, wherein said muting means is connected to the control electrode of one of said first and second transistors.

5. A power amplifier as defined in claim 3 wherein said muting means is connected to the control electrode of one of said third and fourth transistors.

6. A power amplifier as defined in claim 3, further including a further resistance element having a tap, at least one diode and a fifth transistor connected in series across said potential source, the input of said first stage being connected between said further resistance element and said one diode and the input of said second stage being connected between said one diode and said fifth transistor, the control electrode of said fifth transistor being connected to the output of said pre-amplifier portion and said muting means being connected to the tap of said further resistance element.

7. A power amplifier as defined in claim 2, wherein said amplifier portion includes first and second amplifier stages connected together in push-pull amplifier configuration to form a mid-point output, said muting means being connected to the input to one of said first and second stages.

8. A power amplifier comprising a pre-amplifier including a first transistor and a second transistor connected to form a differential amplifier, a power amplifier including first and second transistor means connected to each other in push-pull configuration and having a voltage gain of substantially unity, an output terminal connected to the connection point between said first and second transistor means of said power amplifier, means connected between an output electrode of said second transistor of said pre-amplifier and an input of said push-pull amplifier for transmitting an output signal from said pre-amplifier to the input of said power amplifier, feed-back means connected between said output terminal and an input electrode of said second transistor of said pre-amplifier for feeding back the output signal of said power amplifier to said preamplifier, means connected to an input electrode of said first transistor of said pre-amplifier for applying an input signal to said pre-amplifier, and muting means including a mechanical switch connected to the input of said power amplifier for causing a voltage change at said output terminal sufficient to turn-off said second transistor of the pre-amplifier upon closure of said mechanical switch, the voltage change caused at the output of said power amplifier being transferred to the input electrode of said second transistor of the pre-amplifier through said feed-back means, resulting in a turning-off of said second transistor of the pre-amplifier thereby to block an input signal from being transmitted from the pre-amplifier to the power amplifier.

* * * * *